United States Patent [19]

Mettler

[11] Patent Number: 5,572,200
[45] Date of Patent: Nov. 5, 1996

[54] MULTIDIGIT MULTIPLE COUNTING WHEEL READOUT FOR VOLUME-MEASURING INSTRUMENT OR ELECTRICITY METER

[75] Inventor: Roland Mettler, Kriens, Switzerland

[73] Assignee: GWF Gas-& Wassermesserfabrik AG, Luzern, Switzerland

[21] Appl. No.: 341,226

[22] Filed: Dec. 5, 1994

[30] Foreign Application Priority Data

Dec. 23, 1993 [CH] Switzerland .......................... 03853/93

[51] Int. Cl.$^6$ ................................................. G08B 23/00
[52] U.S. Cl. ............................... 340/870.02; 340/870.05; 340/815.64
[58] Field of Search ...................... 340/870.02, 870.03, 340/870.05, 870.28, 870.29, 609, 637, 686, 688, 815.64; 341/173, 175; 235/436, 103

[56] References Cited

U.S. PATENT DOCUMENTS

| | | | |
|---|---|---|---|
| 3,732,404 | 5/1973 | Jones | 235/113 |
| 4,031,386 | 6/1977 | Recker | 250/230 |

FOREIGN PATENT DOCUMENTS

| | | |
|---|---|---|
| 0202722 | 11/1986 | European Pat. Off. . |
| 2244404 | 4/1974 | Germany . |

*Primary Examiner*—Jeffery Hofsass
*Assistant Examiner*—Andrew Hill
*Attorney, Agent, or Firm*—Greenblum & Bernstein P.L.C.

[57] ABSTRACT

The state or setting of an electronically readable wheel counting wheel mechanism is reliably and unambiguously ascertained for each setting thereof, and for this purpose, the counting wheel mechanism is functionally divided into rotating and stationary wheel packets, in dependence on its setting at the instant of the read-out, wherein the first rotating wheel pack comprises the lowest digit counting wheel a as well as the next higher digit counting wheel b, in case the lowest digit counting wheel a is in the setting between 9 and 0 and so forth, with the stationary wheel packet comprising the rest of the counting wheels. In a rotating wheel packet, the indication or setting of a counting wheel is absolutely ascertained from its angle of rotation, with the inclination of the other counting wheels, of a rotating wheel packet, being ascertained through their rotation relative to the absolutely ascertained counting wheel or through the rotation relative to a previously ascertained wheel.

4 Claims, 7 Drawing Sheets

FIG.6

| NUMERAL SHOWN ON THE WHEEL | ANGLE OF ROTATION IN THE RANGE OF ANGLE DEGREES (°) | THE NUMBER OF DISCRETE MEASURED 12° ANGLES WITHIN THE MEASURED ANGLE OF ROTATION |
|---|---|---|
| 0 | 1 ... 36 | 0 1 2 |
| 1 | 37 ... 72 | 3 4 5 |
| 2 | 73 ... 108 | 6 7 8 |
| 3 | 109 ... 144 | 9 10 11 |
| 4 | 145 ... 180 | 12 13 14 |
| 5 | 181 ... 216 | 15 16 17 |
| 6 | 217 ... 252 | 18 19 20 |
| 7 | 253 ... 288 | 21 22 23 |
| 8 | 289 ... 324 | 24 25 26 |
| 9 | 325 ... 360=0 | 27 28 29 |
| 0 | 1 ... 36 | 0 1 2 |

MULTIDIGIT MULTIPLE COUNTING WHEEL READOUT FOR VOLUME-MEASURING INSTRUMENT OR ELECTRICITY METER

CROSS REFERENCE TO RELATED APPLICATIONS

This application claims the priority of Swiss Application No. CH 03 853/93-8, filed Dec. 23, 1993, the disclosure of which is incorporated herein by reference in its entirety.

BACKGROUND OF THE INVENTION

1. Field of the Invention

Volume-measuring instruments are known for gas and water as well as electricity meters for the measurement of the energy that has flown therethrough, in which the measured volume or the measured energy are transmitted to a mechanical counting wheel mechanism with a step-down ratio adapted to the measuring instrument. The counting wheel mechanism in that case indicates a quantity that has flown therethrough since the last zero setting or since the commissioning or start-up of the instrument. In order to ascertain the consumption during a certain period, the state or setting of the counting wheel mechanism is read at both the beginning and the end of this period.

2. Discussion of the Background of the Invention and Material Information

A preferred construction for the counter read-out of a counting wheel mechanism consists of an axle, on which the counting wheels are mounted so as to be rotatable with respect thereto and on the circumference of the wheels the numerals 0 to 9 are applied, as well as of a second axle having shift pinions rotatably mounted thereon in such a manner that the lower digit counting wheel, in the last tenth of a revolution, each time by way of the associated shift pinion, steps or advances the next higher digit wheel by one tenth of a revolution. A counting wheel mechanism for a water measuring instrument is set forth, for example, in German Patent Publication DE 22 44 404 A1. Depending upon the construction of the measuring instrument, it is important for the achievement of a wide measuring range, with good measuring accuracy, to keep the torque required for driving the counting wheel mechanism as small as possible.

A solution for the electronic read-out of a counting mechanism, in which the continuous rotational movement of the counting wheels is translated into snap movement, is set forth in U.S. Pat. No. 3,732,404. For this purpose, it must be assumed that the spring, or the like, used for the snap movement stores sufficient energy in order to turn the entire wheel counting mechanism or packet forward by one setting or step, for example, from 19,999 to 20,000. A solution, which permits the electronic read-out for a counting mechanism of the needle type, with the use of mechanical contacts without snap movement, is set forth in European Patent Publication EP 20 27 22 B1. It is of course also possible to use a counting mechanism of the needle type in synchronism with the counting mechanism of a wheel counting mechanism.

A rotational angle sensor, which is suitable for the electronic reading-out of a counting wheel mechanism, is described, for example, in yet unpublished Swiss Patent Application CH 02 059/93-5, filed Jul. 11, 1993 and also assigned to the Assignee of this invention. Another suitable rotational angle sensor comprises rotary capacitors that are connected with the counting wheels, which are to be read, and with an associated electronic evaluating system.

A readily rotatable counting wheel mechanism with low driving torque has a certain amount of mechanical rotary play between the individual counting wheels, which play can add up, over several counting wheels, to a large angle of rotation when the counting wheels are in engagement with the shift pinion. Wheels not disposed in a shift engagement are fixed in their setting, apart from a small amount of play, by the associated shift pinion. The rotational play between counting wheels disposed in a shift engagement, on one hand, and the fixing of the counting wheels, not disposed in such an engagement, on the other hand, causes, in multidigit wheel mechanisms, that the indicated numeral on a counting wheel cannot, in all cases, be reliably recognized from the instantaneous angle of rotation of the corresponding counting wheel.

SUMMARY OF THE INVENTION

The present invention has the task or object of indicating a method, which is preferably realized with an electronic circuit, according to which the sensor information data of a counting wheel mechanism can be evaluated with any desired rotary angle sensor for each counting wheel, so as to be read in such a manner that the state of indication or setting of the counting wheel mechanism can be reliably ascertained for each setting thereof without restrictive conditions on the rotational movement of the counting wheel mechanism.

The present invention has the advantage that the state of indication or setting of a counting wheel mechanism in a measuring instrument can be read electronically in digital form with the simplest possible means at any desired instant without the torque required for the drive of the counting wheel mechanism being substantially changed by the means necessary for this purpose.

According to this invention, the evaluation of the sensor information data is therefore undertaken in such a manner that the counting wheels in a shift engagement are distinguished from the fixed counting wheels in a first step and that, for the counting wheels disposed in a shift engagement, their indication or setting is ascertained in a second step from the angle of rotation of a counting wheel and from the relative rotation of adjacent counting wheels. Preferably, the indication of the lowest digit rearmost counting wheel is ascertained from its angle of rotation and the indication of the higher digit counting wheels from the relative rotation with respect to the lower digit counting wheel. In a third step, the-indication of the fixed counting wheel is ascertained.

Specifically, this invention pertains to a multidigit counting wheel mechanism for a volume-measuring instrument including gas, water and electricity meters, the mechanism comprising a plurality of rotatable counting wheels provided with a plurality of peripheral digits ranging in settings from 0 to 9; a plurality of rotatable shift pinions operatively connected with pairs of the counting wheels; wherein in each of two adjacent counting wheels, the adjacent higher digit counting wheel is turned further through one tenth of a revolution, via an associated shift pinion, by the adjacent lower digit counting wheel in the last tenth of the revolution of the latter; a plurality of rotational angle sensors for the generation of signals for the recognition of the setting of the counting wheels; an electronic circuit for ascertaining the instantaneous setting of the counting wheel mechanism;

wherein the electronic circuit divides the counting wheel mechanism functionally into rotating and stationary wheel packets, in dependence on the setting of the counting wheel mechanism at the instant of a read-out; starting with a rotating wheel packet, the rotating wheel packet comprising a lowest digit counting wheel a as well as the next higher digit counting wheel b, in case the lowest digit counting wheel a is in the setting between 9 and 0, as well as again the next higher digit counting wheel c, in case the second lowest digit counting wheel b is in the setting between 9 and 0, and so forth, up to and including one of a counting wheel which is not in the setting between 9 and 0, and up to the highest digit counting wheel of the counting wheel mechanism and, in case the highest counting wheel is not yet reached, continuing with a stationary wheel packet; the stationary wheel packet comprising the next higher digit counting wheel, in case the latter is not in the setting between 9 and 0, as well as again the next higher digit counting wheel, in case the latter is also not in the setting between 9 and 0, and so forth up to and including a counting wheel, which is in one of the settings between 9 and 0 and up to the highest digit counting wheel of the counting wheel mechanism, and, in case the highest digit counting wheel is not yet reached, continuing with a further rotating wheel packet, reaching up to and including a counting wheel, which is one of not in the setting between 9 and 0 and up to the highest digit counting wheel of the counting wheel mechanism, and so forth, up to the highest digit counting wheel of the counting wheel mechanism; and the circuit for ascertaining the instantaneous indication of the counting wheel mechanism absolutely ascertaining, in one of the rotating wheel packet and packets, the indication and setting from the angle of rotation thereof and, in case the corresponding rotating wheel packet comprises more than one counting wheel, the circuit ascertaining the indication of the other counting wheels in the corresponding wheel packet, through the rotation thereof relative to the absolutely ascertained counting wheel, respectively through a rotation relative to a previously ascertained counting wheel.

In one variation of this invention, the circuit for each rotating wheel packet absolutely ascertains the setting of the lowest digit counting wheel from the angle of rotation thereof and that the circuit ascertains the setting of higher digit counting wheels, successively increasing in the rotating wheel packet through the rotation of the higher digit counting wheels relative to the associated neighboring lower digit counting wheel.

In another embodiment of the previous variation, an angle of rotation of up to ±18° in a forward direction is read as indication 9 and in a reverse direction is read as indication 0 and that in the setting between 9 and 0 more than 18° in the forward direction is read as indication 0 and in the reverse direction is read as indication 9.

In a further variation of this invention, the circuit absolutely ascertains the indication of each counting wheel, in each stationary wheel packet, from the angle of rotation thereof.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have generally been used the same reference characters to denote the same or analogous components. A preferred variation or embodiment of the method for ascertaining the wheels disposed in a shift engagement and for ascertaining their indication is shown and described in detail in the following drawings and detailed description, respectively, wherein:

FIG. 1, comprising FIGS. 1a, 1b and 1c, shows an eight digit counting wheel mechanism in forward rotation from 99999999 to 00000000, wherein FIG. 1a shows the beginning of the rotation;

FIG. 1b shows the rotation of the lowest digit counting wheel by 18°; and

FIG. 1c shows the rotation of the lowest digit counting wheel by 36°;

FIG. 2, comprising FIGS. 2a, 2b, and 2c, shows an eight digit counting wheel mechanism in reverse rotation from 00000000 to 99999999, wherein FIG. 2a shows the beginning of the rotation;

FIG. 2b shows the rotation of the lowest digit counting wheel by 18°; and

FIG. 2c shows the rotation of the lowest digit counting wheel by 36°;

FIG. 3, comprising FIGS. 3a, 3b and 3c, shows an eight digit counting wheel mechanism in forward rotation from 34799999 to 34800000, wherein FIG. 3a shows the beginning of the rotation;

FIG. 3b shows the rotation of the lowest digit counting wheel through 18°; and

FIG. 3c shows the rotation of the lowest digit counting wheel through 36°;

FIG. 4, comprising FIGS. 4a, 4b and 4c, shows an eight digit counting wheel mechanism in forward rotation from 34800000 to 34799999, wherein FIG. 4a shows the beginning of the rotation;

FIG. 4b shows the rotation of the lowest digit counting wheel through 18°; and

FIG. 4c shows the rotation of the lowest digit counting wheel through 36°;

FIG. 6 shows the relationship between the numeral shown on the counting wheel, the ascertained angle of rotation, and the number of discrete 12° angles within the ascertained angle of rotation.

DETAILED DESCRIPTION OF THE PREFERRED EMBODIMENTS

Figure 1A:
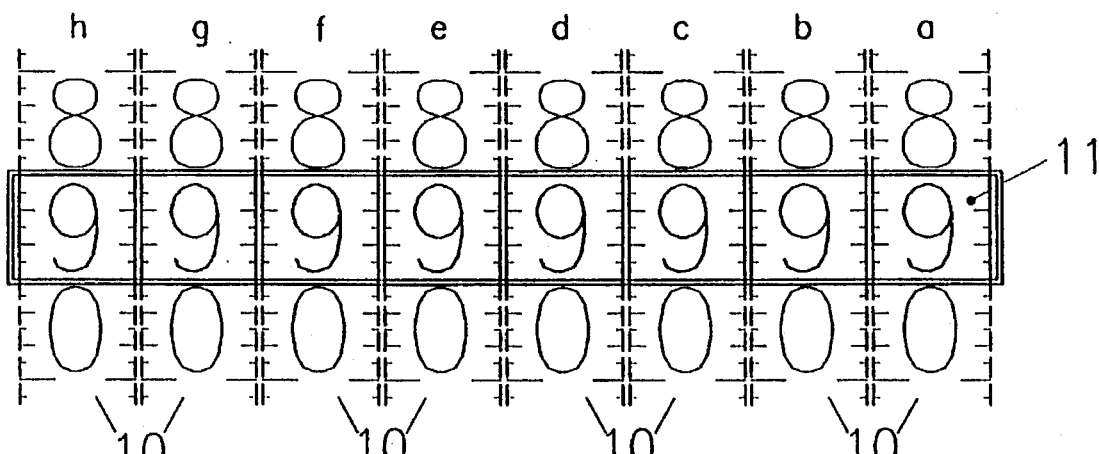

With respect to the drawings it is to be understood that only enough of the construction of the invention and the surrounding environment in which the invention is employed have been depicted therein, in order to simplify the illustrations, as needed for those skilled in the art to readily understand the underlying principles and concepts of the invention.

A conventional eight digit counting wheel mechanism displays eight counting wheels 10, which are denoted by a to h. The highest digit wheel 10 is represented by h and the lowest digit wheel by a. Wheels 10 are visually readable through a window 11, but can also be read or read out through an encoder described in Applicant's own copending U.S. Pat. Application Ser. No. 08/354,039, entitled "Multi-digit Counting Wheel Mechanism for a Volume-Measuring Instrument" filed contemporaneously herewith In the noted copending application, the known functional manner of a conventional wheel mechanism is also described.

In the case of an electronic read-out, according to the invention, of such a counting wheel mechanism, two different rotational setting regions of a counting wheel 10 are distinguished; a first region extends to the unambiguously readable settings of 0 to 9 and a second region to the settings between 9 and 0, in which one counting wheel, each time, is disposed in rotational engagement with the next higher digit counting wheel 10.

At the instant of the read-out, the counting wheel mechanism is divided functionally into several wheel packets 12 and 13, in dependence on its setting. The wheel packets 12 comprise one or more counting wheels 10, which lie, one directly behind the other, and are disposed in rotational engagement with the next higher counting wheel, as well as the next higher digit counting wheel. This means, for example, the lowest counting wheel a, as well as the next higher digit counting wheel b, in case of the lowest digit counting wheel a is in the setting between 9 and 0, as well as again the next higher digit counting wheel c, in case the second lowest digit counting wheel is in the setting between 9 and 0, and so on, up to and including a counting wheel 10, which is not in the setting between 9 and 0, or up to the highest digit counting wheel of the wheel counting mechanism. The wheel packets 12 are here denoted as "rotating" even though at the instant of read-out, not all, or in the case of the just stationary counting mechanism, no counting wheel 10 need rotate. The lowest digit counting wheel a is always regarded as rotating.

A stationary wheel packet 13 comprises all other counting wheels 10. Several wheel packets 13, each with at least one respective counting wheel 10, can appear at the same time.

Figure 1B:
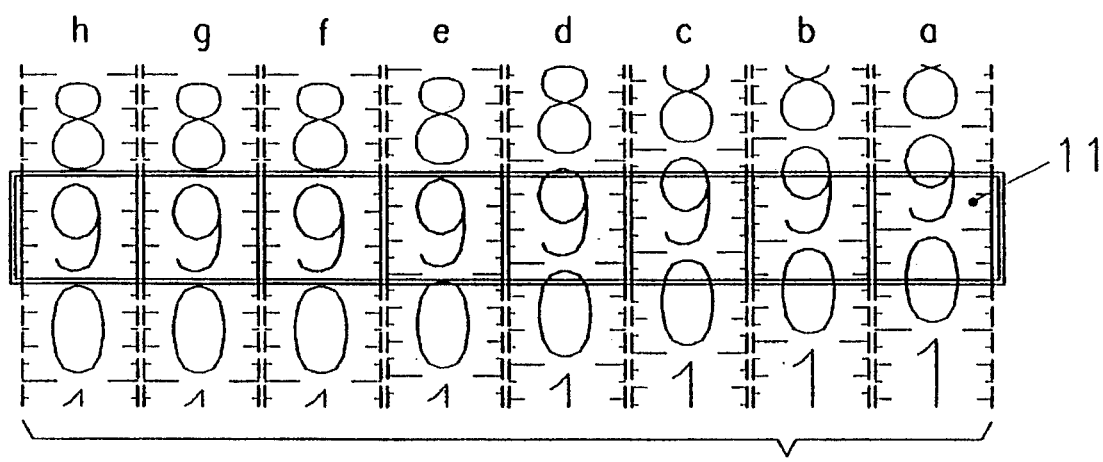
Figure 1C:
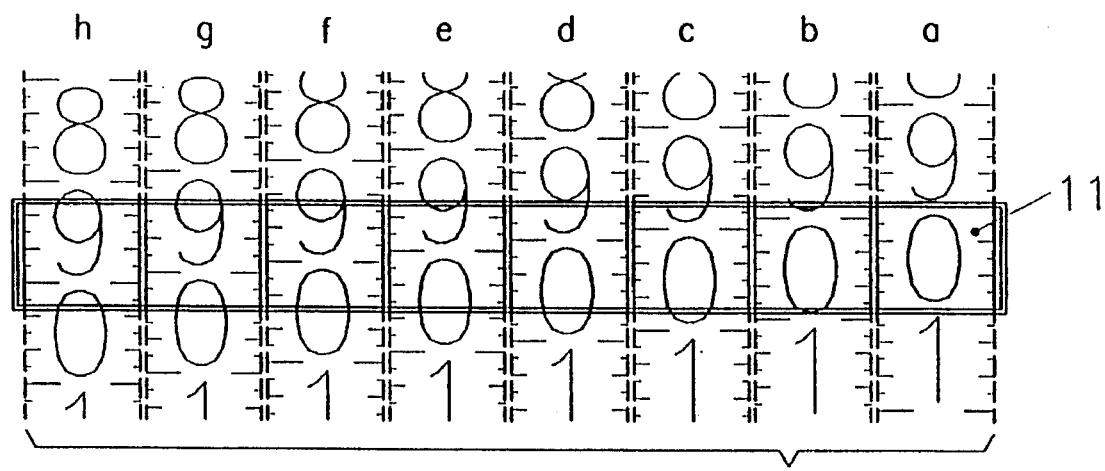
Figure 2A:
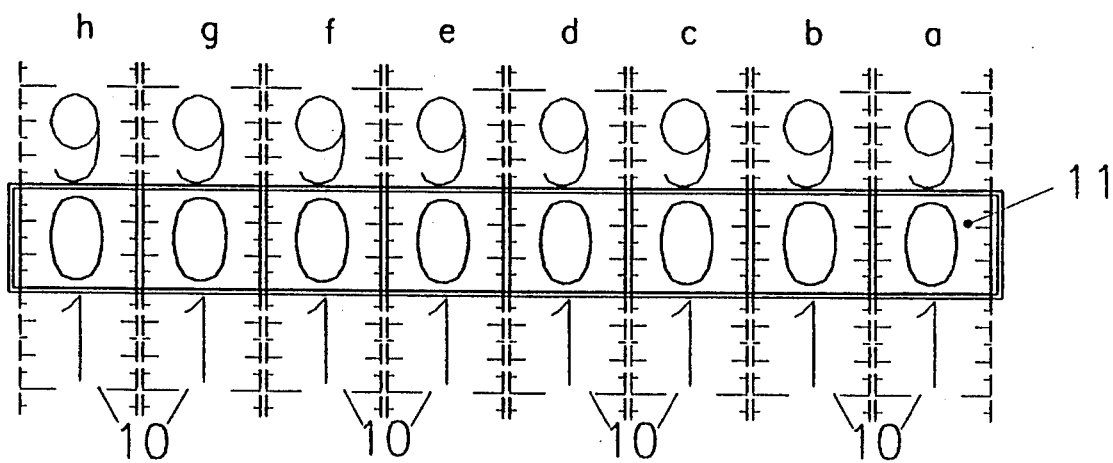
Figure 2B:
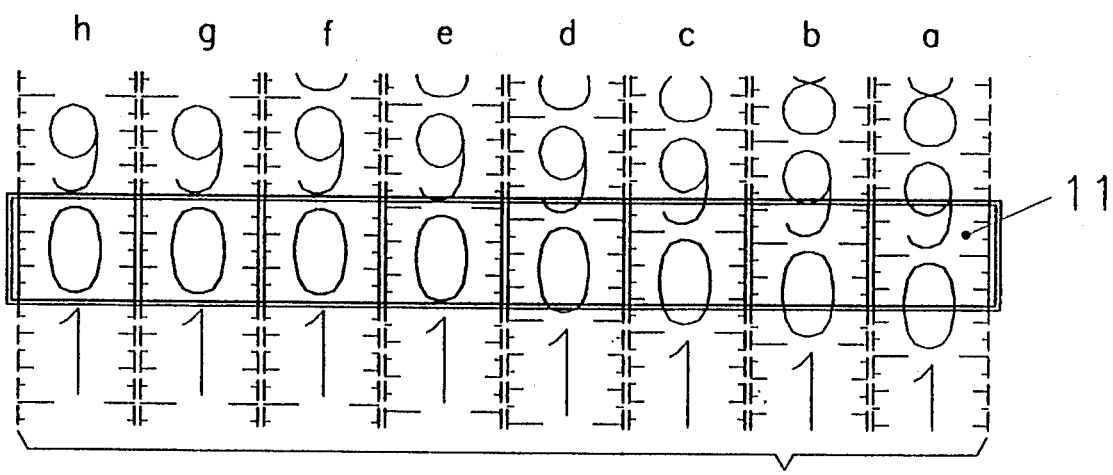
Figure 2C:
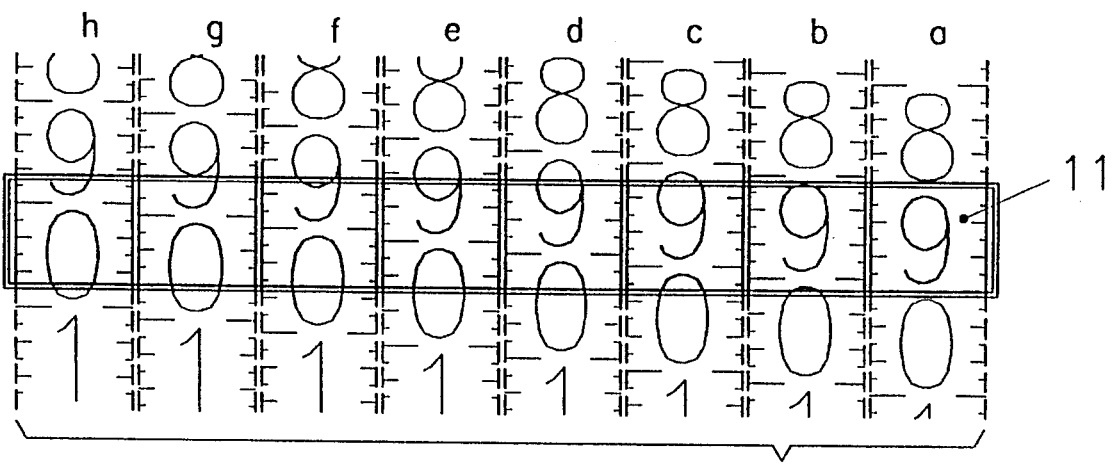
Figure 3A:
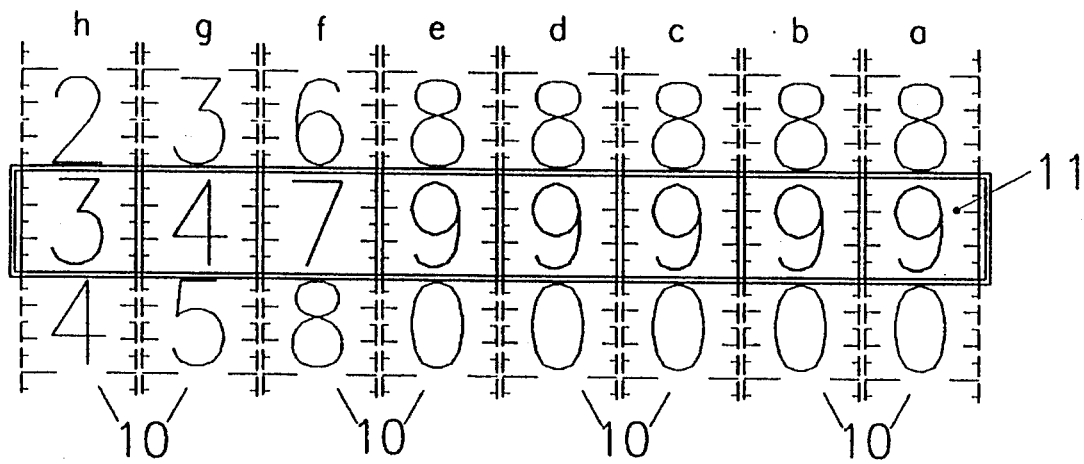
Figure 3B:
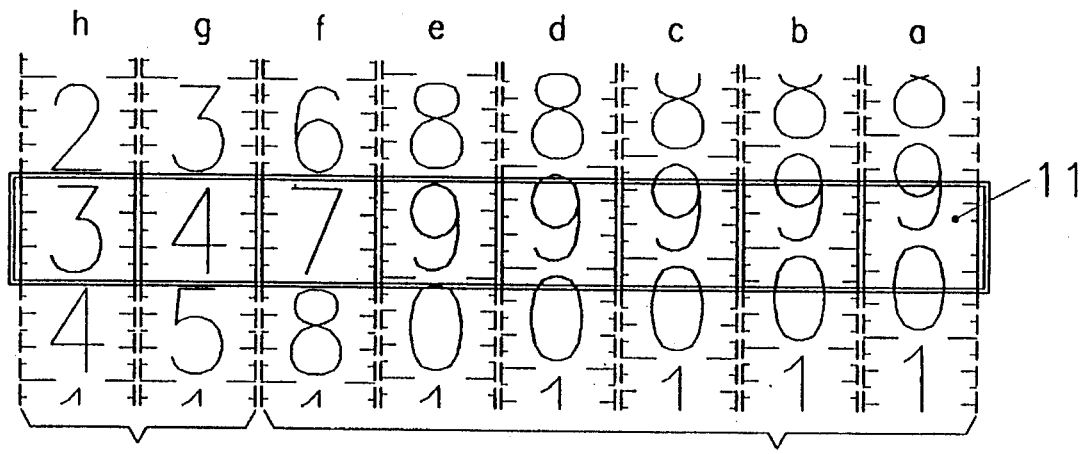

The example shown in FIGS. 1 and 2 show wheel counting mechanisms each with only one rotating wheel packet 12, in which all eight counting wheels 10 are disposed in rotational engagement. The examples of FIGS. 3 and 4 each show a rotating wheel packet 12 and a stationary wheel packet 13.

Figure 5:
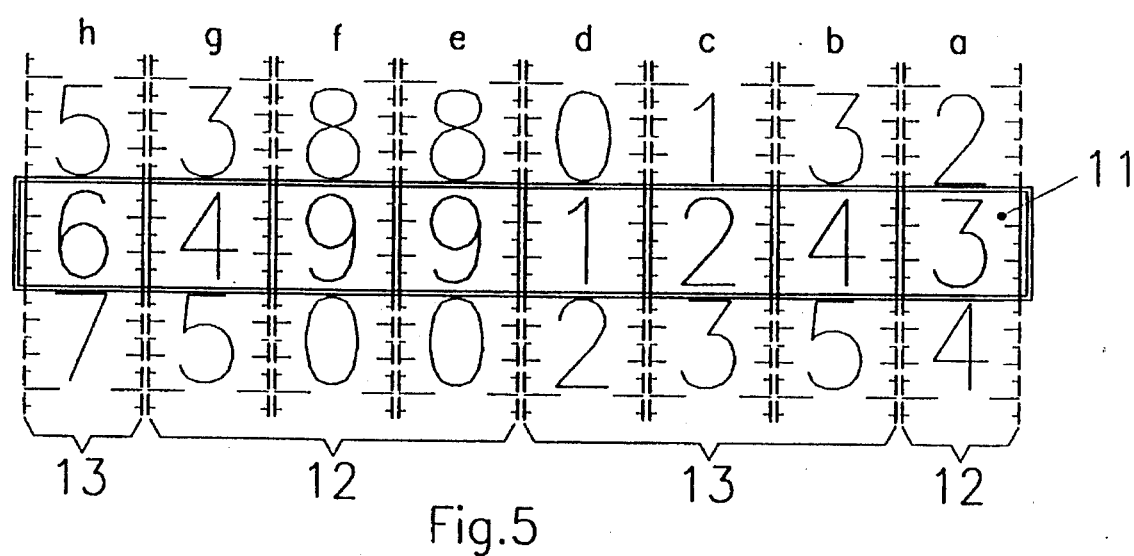
FIG. 5 shows an eight digit counting wheel mechanism in the setting 64991243.

Four wheel packets, namely 12, 13, 12, 13, right to left, are formed in the setting of the counting mechanism in FIG. 5. Counting wheel a, as the lowest digit one, is always considered as belonging to a rotating wheel packet 12. The counting wheels b, c and d are a stationary wheel packet 13. The counting wheels e, f and g again form a rotating wheel packet 12 and the counting wheel h finally represents a stationary wheel packet 13.

An encoder of any conventional design and situated adjacent a counting wheel in any conventional manner, ascertains an instantaneous indication of the position of the rotating wheel packet 12 of the counting wheel mechanism and absolutely ascertains an indication of the position of a counting wheel 10 from the angle of rotation. In case the rotating wheel packet 12 comprises more than one counting wheel 10, the method of the present invention ascertains the position of the other counting wheels 10 in the wheel packet 12 through their rotation relative to the absolutely ascertained counting wheel 10 or through the rotation relative to a previously ascertained counting wheel 10.

If, for example, s is to be ascertained as the highest digit wheel in shift engagement and whose angle of rotation is to be determined, then the method includes the following steps: Set s=a. However, when the angle of a is determined to be within the range between 337° and 24°, which is an indication that a is in the range between "9" and "0", then s is set equal to b; otherwise s is equal to a. When s is equal to b, and the absolute amount or the sum of the angle of rotation of b minus the rotational angle of a is less than 18°, then s is set to c; otherwise s is equal to b. When s is equal to c, and the absolute amount of the sum of the angle of rotation of c minus the angle of rotation of b is less than 18°, then s is set to equal d; otherwise s is equal to c. When s is equal to d, and the absolute amount or the sum of the angle of rotation of d minus the angle of rotation of c is less than 18°, then s is set equal to e; otherwise s is equal to d. When s is equal to e, and the absolute amount or the sum of the angle of rotation of e is less than the angle of rotation of d is less than 18°, then s is set equal to f; otherwise s is equal to e. When s is equal to f, and the absolute amount or the sum of the angle of rotation of f minus the angle of rotation of e is less than 18°, then s is set equal to g; otherwise s is equal to f. When s is equal to g, and the absolute amount or the sum of the angle of rotation of g minus the angle of rotation of f is less than 18°, then s is set equal to h; otherwise s is equal to f. Thereby s is ascertained as the highest digit counting wheel in shift engagement.

The table shown in FIG. 6 shows the relationship between the numeral shown on the counting wheel (column 1), the ascertained angle of rotation (column 2), and the number of discrete 12° angles within the ascertained angle of rotation (column 3).

In the following, the indication of the counting wheel disposed in a shift engagement is ascertained.

Even in the case of only low measuring accuracy of the angle of rotation and large rotational play of the counting wheels 10, the counting mechanism can still be read out with sufficient accuracy, when a distinction is made between the angles of rotation of smaller and greater than ±18°. An angle of rotation up to ±18° is then read as indication 9 in the forward direction of rotation and as indication 0 in the reverse direction of rotation. An angle of rotation above 18° is read as indication 0 in the forward direction of rotation and as indication 9 in the reverse direction of rotation.

For the practical application of the above method, an angle of rotation sensor may be used that is of any conventional design known to those ordinarily skilled in the art.

Figure 7:
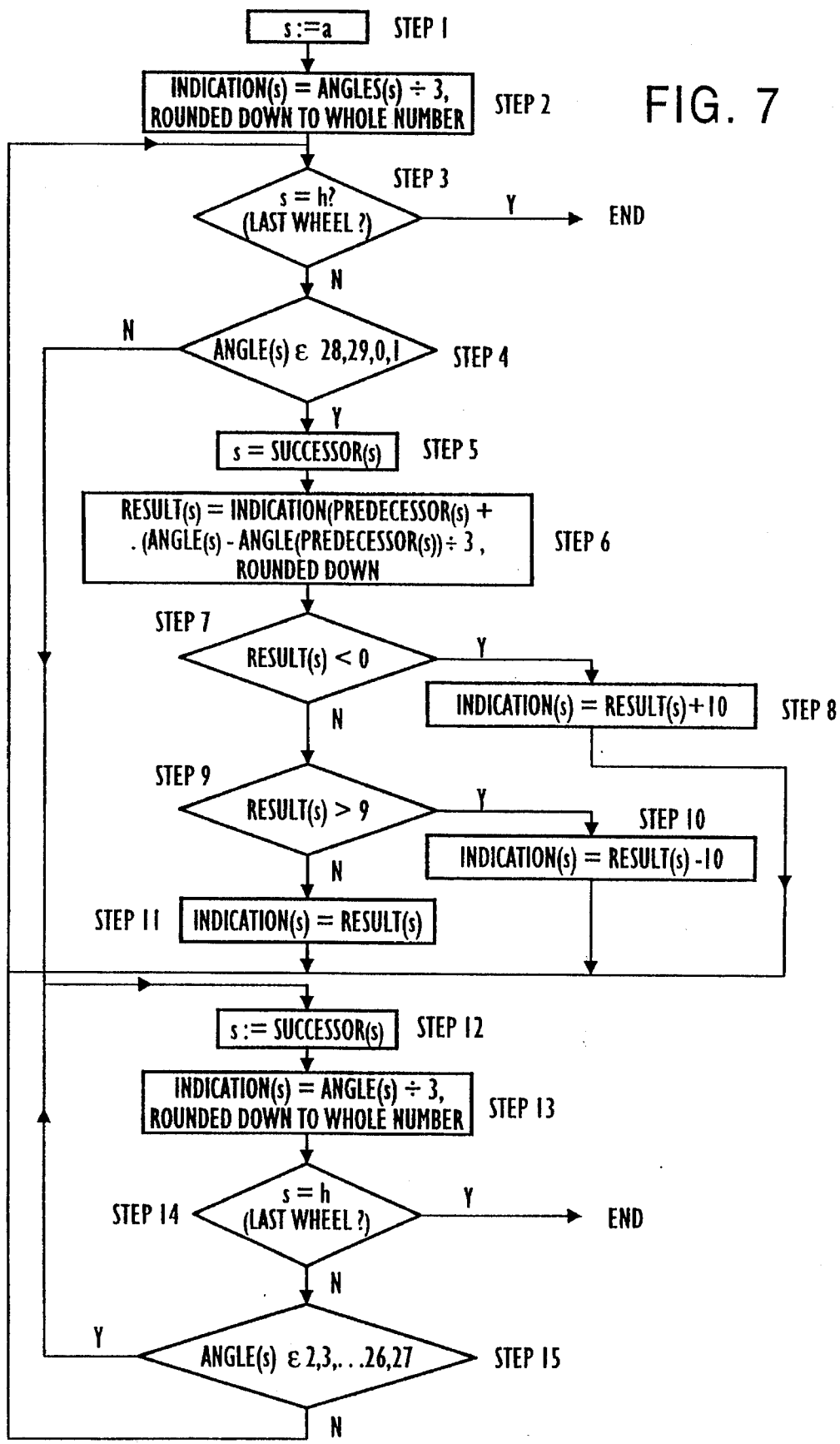
FIG. 7 shows an exemplary flow diagram for the readout of the wheel position indicator.

FIG. 7 shows an exemplary flow diagram for the computation/evaluation of the wheel position for a wheel indicating a change in position for each 12° angle of rotation, for example, ash shown in FIG. 6, column 3.

In this example s represents a wheel within the range of a to h. The mathematical function "successor (s)" represents the next higher value wheel positioned next to the wheel defined as s, e.g., successor (b) is wheel c. The mathematical function "predecessor (s)" represents the next lower value wheel positioned next to the wheel defined as s, e.g., predecessor (e) is wheel d. The mathematical function "angle (s)" represents the discrete number of 12° angles that the wheel has rotated through in accordance with the table in FIG. 6, column 3. The mathematical function "indication (s)" represents the numeral shown on the peripheral edge of wheel s.

Figure 4A:
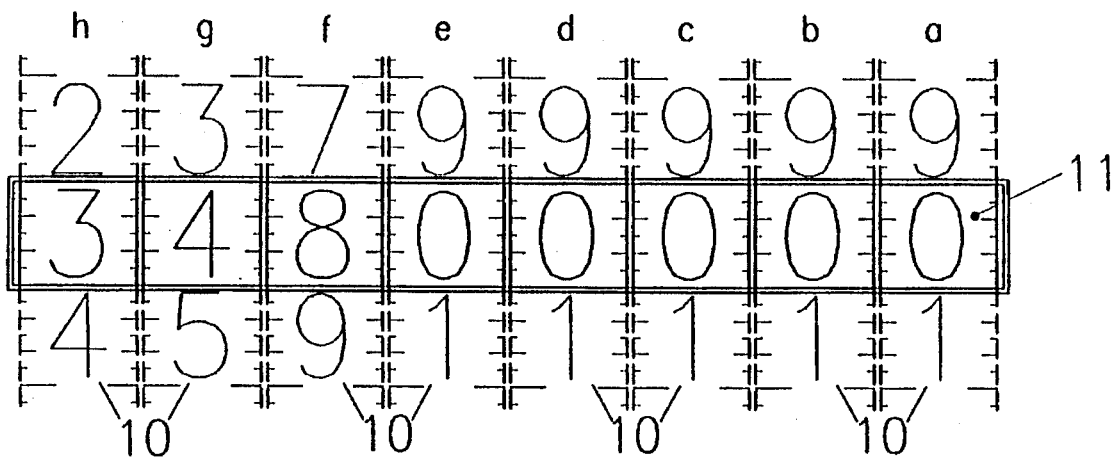

Using the wheel positions of FIG. 4a as an example, the method described by the flow diagram of FIG. 7 will be carried out for determining the wheel position, i.e., numeral shown in the viewing window.

Figure 3C:
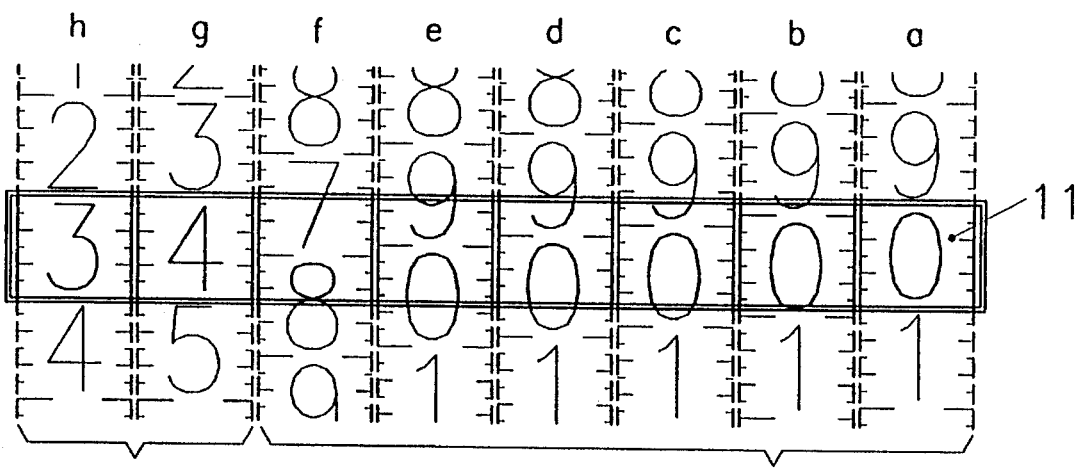
Figure 4B:
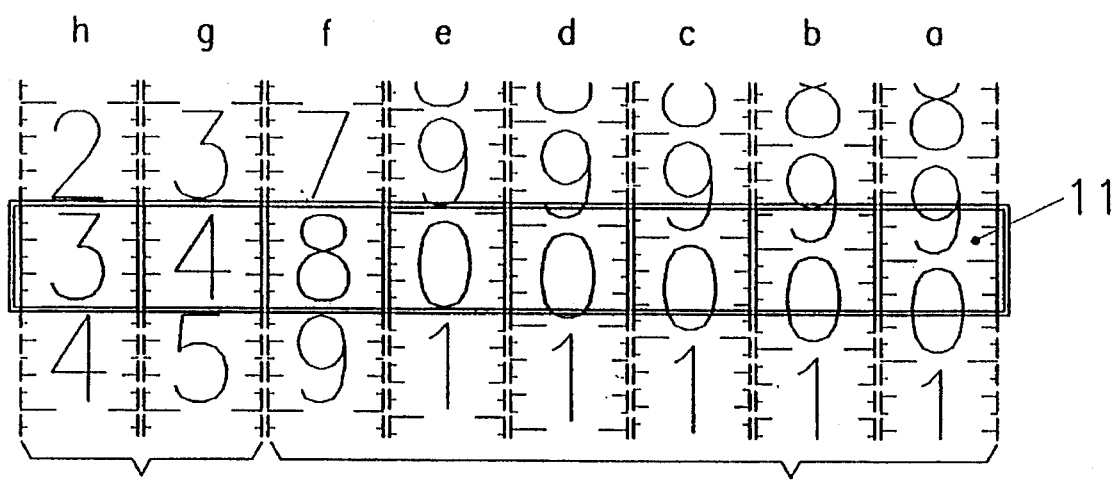

In step 1, wheel s is set equal to wheel a (the lowest value wheel). In step 2, indication (s) is set equal to the whole number result of angle (s)÷3. As shown in FIG. 3c, angle (a)

is 0, therefore indication (a) is equal to the whole number result of 0÷3=0. Step 3 determines whether the s=h. If yes, the program ends; if no, the program proceeds to step 4 to determine whether the angle (s) is any one of 28, 29, 0, or 1. If no, the program proceeds to step 12; if yes, the program will set s equal to successor (s) in step 5, e.g., s now equals successor (a), which is b.

In step 6, result (s) is determined to equal indication (successor (s)) plus the whole number result of one-third of the difference between angle (s) and angle (predecessor (b)). In the present example, angle (b) is 29, angle (a) is 0, indication (a) is 0. The whole number result of one-third of 29–0 is 10. Accordingly, result (b) will be equal to 0+10=10. Step 7 determines whether result (s) is less than 0. If yes, the program proceeds to step 8; if no, the program proceeds to step 9. Because result (b) is 10, the program proceeds to step 9 to determine whether result (s) is greater than 9. If no, the program proceeds to step 11; if no, the program proceeds to step 10. Because result (b) is 10, the program proceeds to step 10 to set indication (s) equal to result (s)–10. Accordingly, step 10 determines that indication (b) is equal to 10–10, which is 0. The program now returns to step 3 to determine whether the position of the last wheel has been determined. Because b is not the last wheel, the program proceeds to step 4 to determine whether angle (b) is one of 28, 29, 0, or 1. Because angle (b) is within the range, step 5 sets s equal to successor (b), or c.

In step 6, angle (c) is 29, angle (b) is 29, and indication (b) is 0. Thus, result (c) is equal to 0+the whole number result of [3÷(29–29)], or 0. Because result (c) is not less than 0 and not more than 9, the program proceeds to step 11, where indication (s) is determined to be equal to result (s). Thus, indication (c) is determined to be 0. The program again returns to step 3 to determine whether wheel c is the last wheel. Because it is not, and angle (c) is within 28, 29, 0 and 1, s is set to successor (c), or d.

In step 6, angle (d) is 28, angle (c) is 29, and indication (c) is 0. Thus, result (d) is equal to 0+the whole number result of [3÷(28–29)], which is 0. Because result (d) is not less than 0 and not more than 9, the program proceeds to step 11, where indication (s) is determined to be equal to result (s). Thus, indication (d) is determined to be 0. The program again returns to step 3 to determine whether wheel d is the last wheel. Because it is not, and angle (c) is within 28, 29, 0 and 1, s is set to successor (d), or e.

In step 6, angle (e) is 28, angle (d) is 28, and indication (d) is 0. Thus, result (e) is equal to 0+the whole number result of [3+(28–28)], which is 0. Because result (e) is not less than 0 and not more than 9, the program proceeds to step 11, where indication (s) is determined to be equal to result (s). Thus, indication (e) is determined to be 0. The program again returns to step 3 to determine whether wheel e is the last wheel. Because it is not, and angle (c) is within 28, 29, 0 and 1, s is set to successor (e), or f.

In step 6, angle (f) is 22, angle (e) is 28, and indication (e) is 0. Because angle (f) is not 28, 29, 0, or 1 (in step 4), the program proceeds to step 12 in which s is equal to successor (s). In other words, f is equal to Thus, result (f) is equal to 0+the whole number result of [3÷(22–28)], which is 2. Because result (f) is less than 0, the program proceeds to step 8, where indication (s) is determined to be equal to result (s)+0. Thus, indication (f) is determined to be −2+10, or 8. The program again returns to step 3 to determine whether wheel f is the last wheel. Because it is not, step 4 determines whether angle (f) is within 28, 29, 0, or 1. Because angle (f) is not within this set, the program proceeds to step 12. At step 12, s is set to successor (f), or g.

In step 13, indication (s) is determined to be the whole number result of angle (s) divided by 3. Thus, indication (g) is the whole number result of angle (g)÷3, where angle (g) is 13 and indication (g) is the whole number result of 13÷3, or 4. At step 14, the program determines whether s is the last wheel. If yes, the program ends; if no, the program proceeds to step 15 to determine whether angle (s) is within the set of 2–27. If yes, the program proceeds to step 12; if no, the program proceeds to step 3. Because g is not the last wheel and angle (g) is 13, the program will return to step 12 and set s equal to successor (g), or h.

In step 13, angle (h) is 10 and indication (h) is the whole number result of 10÷3, or 3. At step 14, the program determines whether s is the last wheel. Because h is the last wheel the program ends. The combined value of the indication is 34800000.

Figure 4C:
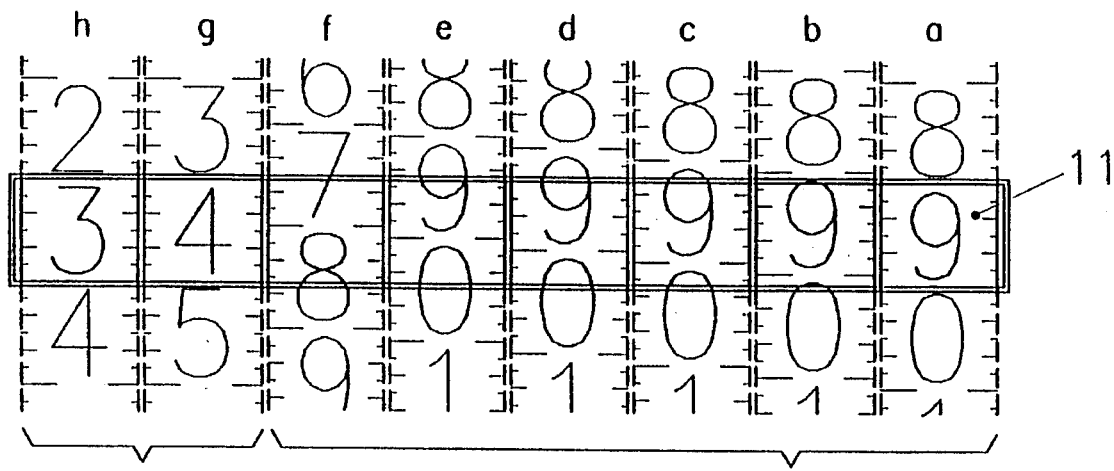

If wheel a were displaced one digit in the direction of 9, i.e. , as shown in FIG. 4c, the combined value of the indication would be determined as follows:

Angle (a) is 29, at step 2, indication (a) is the whole number result of angle (a)÷3, i.e., the whole number result of 29 3÷9. After s is set to b, angle (b) is 29, angle (a) is 29, and indication (a) is 9. Thus, result (b) is 9+[(29–29)÷3], or 9, and indication (b) is 9. After s is set to c, angle (c) is 28, angle (b) is 29 and indicator (b) is 9, result (c) is 9+[(28 −29)÷3], or 9, and indication (c) is 9. After s is set to d, angle (d) is 28, angle (c) is 28, and indication (c) is 9, result (d) is 9+[(28–28)÷3], or 9, and indication (d) is 9. After s is set to e, angle (e) is 28, angle (d) is 28, and indication (d) is 9. Thus, result (e) is 9+[(28–28)÷3], or 9, and indication (e) is 9. After s is set to f, angle (f) is 22, angle (e) is 28, and indication (e) is 9. Thus, result (f) is 9+[(22–28) ÷3], or 7, and indication (f) is 7. After s is set to g (in step 12), angle (g) is 13. Thus, indication (g) is the whole number result of 13÷3, or 4. After s is set to h, angle (h) is 0. Thus, indication (h) is 3. Because h is the last wheel, the program ends and the combined value indicated is 34799999.

While there are shown and described present preferred embodiments of the invention, it is to be distinctly understood that the invention is not limited thereto, but may be otherwise variously embodied and practiced within the scope of the following claims and the reasonably equivalent structures thereto. Further, the invention illustratively disclosed herein may be practiced in the absence of any element which is not specifically disclosed herein.

What is claimed is:

1. A method for reading a read-out of a multidigit, multiple counting wheel mechanism for a volume-measuring instrument including gas, water and electricity meters, each multidigit counting wheel, displaying digits from 0 through 9 on its peripheral edge, arranged in parallel and rotating about a common axis, the digits to be read-out being displayed through a window in the meter, said method comprising:

A. dividing the displayed digits to be read out into rotating wheel packets and stationary wheel packets, wherein the rotating wheel packet includes one of a least significant digit counting wheel; the least significant digit counting wheel and adjacent counting wheels when each displays the digit 9 and the next highest digit counting wheel not displaying the digit 9; and an instance of one or more counting wheels displaying the digit 9 and the next highest digit counting wheel not displaying the digit 9, such that a one-tenth revolution rotation of a lowest digit counting wheel within the rotating wheel packet will advance each of a remaining counting wheels of the rotating wheel packet one digit, and wherein the stationary wheel packet includes a group of at least one counting wheel, each counting wheel in the group not displaying the digit 9 and not positioned as the next higher digit counting wheel adjacent a counting wheel displaying the digit 9, B. determining an instantaneous angle of rotation of the least significant digit counting wheel with respect to 0°;

C. ascertaining instantaneous displayed digits of a first rotating wheel packet, which includes at least the least significant digit counting wheel, the displayed digit of the least significant digit counting wheel ascertained in accordance with the determined instantaneous angle of rotation of the least significant digit counting wheel, wherein, if the rotating packet includes additional counting wheels, said method further comprising:

D. determining the angle of rotation, with respect to 0°, of the next higher digit counting wheel, the indication of the displayed digit of the next higher counting wheel digit ascertained in accordance with a difference between the determined instantaneous angle of rotation of the next higher digit counting wheel and the determined angle of rotation of an adjacent lower digit counting wheel, and repeating step D until each displayed digit within the rotating packet has been ascertained;

E. determining whether the displayed digit of a most significant digit counting wheel has been ascertained, wherein if the displayed digit of the most significant digit counting wheel has been ascertained, ending said method, wherein if the displayed digit of the most significant digit counting wheel has not been ascertained, the method further comprises:

F. determining an instantaneous angle of rotation for the lowest digit counting wheel of one of a first or a next stationary packet with respect to 0°;

G. ascertaining instantaneous displayed digits of a first stationary packet, which includes at least the lowest digit counting wheel of the first stationary packet, the displayed digit of the lowest digit counting wheel ascertained in accordance with the determined instantaneous angle of rotation of the lowest digit counting wheel, wherein, if the stationary packet includes additional counting wheels, said method further comprising:

H. determining an instantaneous angle of rotation, with respect to 0°, of the next higher digit counting wheel, and determining the displayed digit of the next higher digit counting wheel in accordance with the determined instantaneous angle of rotation of the next higher digit counting wheel, and repeating step H until each displayed digit within the stationary packet has been ascertained;

I. determining whether the displayed digit of the most significant digit counting wheel has been ascertained, wherein if the displayed digit of the most significant digit counting wheel has been ascertained, ending said method, wherein if the displayed digit of the most significant digit counting wheel has not been ascertained, the method further comprises:

J. returning to step D and continuing the method until the displayed digit of the most significant digit counting wheel has been ascertained.

2. The method according to claim 1, wherein in step D, when the indication of the displayed digit of the next higher counting wheel digit determined in accordance with a difference between the determined instantaneous angle of rotation of the next higher digit counting wheel and the determined angle of rotation of an adjacent lower digit counting wheel is determined to be greater than 9, the indication of the displayed digit is reduced by 0.

3. The method according to claim 1, wherein in step D, when the indication of the displayed digit of the next higher counting wheel digit determined in accordance with a difference between the determined instantaneous angle of rotation of the next higher digit counting wheel and the determined angle of rotation of an adjacent lower digit counting wheel is determined to be less than 0, the indication of the displayed digit is increased by 0.

4. The method according to claim 1, said method further comprising:

wherein when the wheel is rotating in a direction in which the displayed digits increase in value upon each one-tenth revolution, when the determined angle of rotation with respect to 0° is between 342° and 18°, the indication of the displayed digit is ascertained to be the digit 9, and wherein when the wheel is rotating in a direction in which the displayed digits decrease in value upon each one-tenth revolution, when the determined angle of rotation with respect to 0° is between 342° and 18°, the indication of the displayed digit is ascertained to be the digit 0.

* * * * *